United States Patent
Uchida

(10) Patent No.: US 7,438,780 B2
(45) Date of Patent: Oct. 21, 2008

(54) MANUFACTURING METHOD FOR BASE PIECE MADE TO ADHERE TO ADHESIVE SHEET, MANUFACTURING METHOD FOR SEMICONDUCTOR WAFER AND MANUFACTURING METHOD FOR SEMICONDUCTOR DEVICE

(75) Inventor: Kenji Uchida, Kasaoka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/149,520

(22) Filed: Jun. 9, 2005

(65) Prior Publication Data
US 2005/0274451 A1 Dec. 15, 2005

(30) Foreign Application Priority Data
Jun. 11, 2004 (JP) ............................. 2004-174721

(51) Int. Cl.
| | | |
|---|---|---|
| B29C 65/50 | (2006.01) | |
| B29C 65/54 | (2006.01) | |
| B32B 37/12 | (2006.01) | |
| B32B 37/14 | (2006.01) | |
| B32B 37/16 | (2006.01) | |
| H01L 21/02 | (2006.01) | |
| B29C 65/02 | (2006.01) | |
| B29C 65/56 | (2006.01) | |
| H01L 21/033 | (2006.01) | |

(52) U.S. Cl. ................... 156/249; 156/230; 156/235; 156/236; 156/247; 156/250; 438/455; 438/460; 438/464

(58) Field of Classification Search ............... 156/230, 156/235, 236, 240, 247, 249, 350, 250; 438/460, 438/464, 455, 458
See application file for complete search history.

(56) References Cited

U.S. PATENT DOCUMENTS

H208 H * 2/1987 Ng et al. ..................... 257/737

(Continued)

FOREIGN PATENT DOCUMENTS

JP 03-151666 6/1991

(Continued)

OTHER PUBLICATIONS

European Search Report in EPO 05253596.0.

*Primary Examiner*—Philip C Tucker
*Assistant Examiner*—Sonya Mazumdar
(74) *Attorney, Agent, or Firm*—Edwards Angell Palmer & Dodge LLP; Mark D. Russett; David G. Conlin

(57) ABSTRACT

A first adhesive sheet is made to adhere to glass in plate form, and after that, the glass is cut with a blade so as to be separated into a number of glass pieces. A second adhesive sheet is made to adhere to the surfaces of glass pieces on the side opposite to the surface to which the first adhesive sheet is made to adhere. The first adhesive sheet is peeled from the glass pieces. The first adhesive sheet is peeled in the state where glass chips that have been created in the process for cutting the glass adhere to the first adhesive sheet, and therefore, most of the glass chips which adhere to the first adhesive sheet are removed with the respective glass pieces in the state of adhering to the second adhesive sheet not being scattered.

5 Claims, 7 Drawing Sheets

U.S. PATENT DOCUMENTS

| | | | |
|---|---|---|---|
| 5,591,290 A * | 1/1997 | Walter et al. | 156/152 |
| 5,888,883 A * | 3/1999 | Sasaki et al. | 438/460 |
| 6,087,202 A * | 7/2000 | Exposito et al. | 438/113 |
| 6,428,650 B1 * | 8/2002 | Chung | 156/250 |
| 6,558,975 B2 * | 5/2003 | Sugino et al. | 438/64 |
| 6,607,970 B1 | 8/2003 | Wakabayashi | |
| 6,730,579 B1 * | 5/2004 | Sasaka | 438/464 |
| 2003/0122137 A1 | 7/2003 | Hashimoto | |
| 2004/0189854 A1 | 9/2004 | Tsukamoto et al. | |
| 2005/0163016 A1 | 7/2005 | Kimura et al. | |

FOREIGN PATENT DOCUMENTS

| | | | |
|---|---|---|---|
| JP | 03257035 A * | 11/1991 | |
| JP | 3165192 | 12/1992 | |
| JP | 05-041461 | 2/1993 | |
| JP | 2003 086540 A | 3/2003 | |
| JP | 2003-224085 | 8/2003 | |
| JP | 2003224085 A * | 8/2003 | |
| JP | 2004 040050 A | 2/2004 | |
| JP | 2004-296453 | 10/2004 | |
| JP | 2004-301938 | 10/2004 | |
| JP | 2005-216970 | 8/2005 | |

* cited by examiner

US 7,438,780 B2

MANUFACTURING METHOD FOR BASE PIECE MADE TO ADHERE TO ADHESIVE SHEET, MANUFACTURING METHOD FOR SEMICONDUCTOR WAFER AND MANUFACTURING METHOD FOR SEMICONDUCTOR DEVICE

CROSS-REFERENCE TO RELATED APPLICATIONS

This Nonprovisional application claims priority under 35 U.S.C. §119(a) on Patent Application No. 2004-174721 filed in Japan on Jun. 11, 2004, the entire contents of which are hereby incorporated by reference.

BACKGROUND OF THE INVENTION

The present invention relates to a method for manufacturing a number of base pieces, such as glass pieces or pieces of silicon substrate that are made to adhere to an adhesive sheet, as well as to a manufacturing method for a semiconductor wafer and a manufacturing method for a semiconductor device which utilize this manufacturing method for base pieces that are made to adhere to an adhesive sheet.

A technology has been disclosed where glass is made to adhere to chips in wafer state, so as to cover the image sensor portions of the respective chips, which are then separated from each other, and thereby, damage to the image sensor portions caused by scratches and the attachment of debris to the image sensor portions can be prevented (see, for example, Japanese Patent Application Laid-Open No. 3-151666 (1991)). Japanese Patent Application Laid-Open No. 3-151666(1991), however, does not describe how small pieces of glass which are made to adhere to the image sensor portions are manufactured.

In addition, a manufacturing technique for pieces of glass which are used as lids provided with packages of semiconductor elements having light receiving portions, such as semiconductor elements of memories that are programmable/erasable by means of ultraviolet rays (EPROM's) or CCD's, has been proposed (see, for example, Japanese Patent Applictaion Laid-Open No. 5-41461(1993)).

In Japanese Patent Application Laid-Open No. 5-41461 (1993), it is necessary to cut a glass plate in order to manufacture glass pieces, and a problem arises where the removal of glass chips that are created at the time of cutting may be insufficient. FIGS. 1A and 1B are diagrams showing conventional steps for manufacturing glass pieces. An adhesive sheet 41 is made to adhere to glass 42 in plate form (FIG. 1A). Next, glass 42 is cut using a blade 43, so as to be separated into a number of pieces of glass 42a (FIG. 1B). Then the separated pieces of glass 42a are one by one peeled from adhesive sheet 41, and are utilized as lids of, for example, packages of semiconductor elements.

FIG. 2 is an enlarged diagram of region A in FIG. 1B. Glass chips 45 are created at the time of cutting of glass 42 as shown in FIG. 1B. The created glass chips 45 are attached to glass pieces 42a due to static electricity. In the case where a piece of glass 42a in the state where glass chips 45 are attached is utilized for a semiconductor device, these glass chips 45 sometimes cause a defect in the semiconductor device. Accordingly, it is necessary to remove the created glass chips 45 so that glass chips 45 do not adhere to pieces of glass 42a. Thus, a means for removing glass chips 45 through the blowing of a gas or by washing with water has conventionally been carried out, wherein a problem arises where a gas or water for removing the chips do not sufficiently reach particularly the corner portions (regions B in FIG. 2) of the cut parts, and glass chips 45 are not completely removed and are left in the corner portions.

BRIEF SUMMARY OF THE INVENTION

The present invention is provided in view of the above described situation and an object thereof is to provide a manufacturing method for a base piece made to adhere to an adhesive sheet where base chips that are created at the time of cutting of a base such as glass can be easily and almost completely removed.

Another object of the present invention is to provide a manufacturing method for a base piece made to adhere to an adhesive sheet where debris that adheres to a film that has been formed on one surface of a base piece can be removed.

Still another object of the present invention is to provide a manufacturing method for a semiconductor wafer and a manufacturing method for a semiconductor device where occurrence of defects caused by base chips can be restricted.

In accordance with a manufacturing method for a base piece made to adhere to an adhesive sheet according to the present invention, a base that is made to adhere to a first adhesive sheet is cut into a number of base pieces and a second adhesive sheet is made to adhere to the surfaces of the base pieces on the side opposite to the surfaces which are made to adhere to the first adhesive sheet. According to the present invention, the base that is made to adhere to the first adhesive sheet is cut into a number of base pieces, and after that, the second adhesive sheet is made to adhere to the surfaces of the base pieces on the side opposite to the surfaces which are made to adhere to the first adhesive sheet. By doing so, when the first adhesive sheet is peeled from the base pieces, almost all of the base chips that have occurred at the time of cutting, including the base chips which are placed in the corner portions of the cut parts, can be easily removed in the state of adhering to the first adhesive sheet.

In accordance with a manufacturing method for a base piece made to adhere to an adhesive sheet according to the present invention, a base that is made to adhere to a first adhesive sheet is cut into a number of base pieces, a second adhesive sheet is made to adhere to the surfaces of the base pieces on the side opposite to the surfaces which are made to adhere to the first adhesive sheet, and the first adhesive sheet is peeled from the base pieces. According to the present invention, the base that is made to adhere to the first adhesive sheet is cut into a number of base pieces, and after that, the second adhesive sheet is made to adhere to the surfaces of the base pieces on the side opposite to the surfaces which are made to adhere to the first adhesive sheet, and then the first adhesive sheet is peeled from the base pieces. Accordingly, almost all of the base chips that have occurred at the time of cutting, including the base chips which are placed in the corner portions of the cut parts, can be easily removed in the state of adhering to the first adhesive sheet.

In accordance with a manufacturing method for a base piece made to adhere to an adhesive sheet according to the present invention, a film has been formed on the surface of the base on the side opposite to the surface which is made to adhere to the first adhesive sheet, and after the first adhesive sheet is peeled, a third adhesive sheet is made to adhere to the surfaces of the base pieces to which the first adhesive sheet has been made to adhere, in the above described manufacturing method. According to the present invention, as described above, the third adhesive sheet is made to adhere to the surface on the side to which the first adhesive sheet has been made to adhere after the first adhesive sheet is peeled. By doing so, when the second adhesive sheet is peeled from the base pieces, debris that has adhered to the films on the base pieces is easily removed in the state of adhering to the second adhesive sheet. In addition, this second adhesive sheet serves to protect the films on the base pieces.

In accordance with a manufacturing method for a base piece made to adhere to an adhesive sheet according to the present invention, a film has been formed on the surface of the base on the side opposite to the surface which is made to adhere to the first adhesive sheet, and after the first adhesive sheet is peeled, a third adhesive sheet is made to adhere to the surfaces of the base pieces to which the first adhesive sheet has been made to adhere and the second adhesive sheet is peeled from the base pieces in the above described manufacturing method. According to the present invention, as described above, the third adhesive sheet is made to adhere to the surface on the side to which the first adhesive sheet has been made to adhere, and then, the second adhesive sheet is peeled from the base pieces after the first adhesive sheet has been peeled. Accordingly, debris that has adhered to the films on the base pieces is easily removed in the state of adhering to the second adhesive sheet.

In accordance with a manufacturing method for a semiconductor wafer according to the present invention, a base that is made to adhere to a first adhesive sheet is cut into a number of base pieces, a second adhesive sheet is made to adhere to the surfaces of the base pieces on the side opposite to the surfaces which are made to adhere to the first adhesive sheet, the first adhesive sheet is peeled from the base pieces, and the base pieces are removed from the second adhesive sheet and are made to adhere to a semiconductor wafer. According to the present invention, the base that is made to adhere to the first adhesive sheet is cut into a number of base pieces, and after that, the second adhesive sheet is made to adhere to the surfaces of the base pieces on the side opposite to the surfaces which are made to adhere to the first adhesive sheet, and then the first adhesive sheet is peeled from the base pieces and the base pieces that have been peeled from the second adhesive sheet are made to adhere to the semiconductor wafer. Accordingly, base chips are almost completely removed together with the first adhesive sheet, and thus, base pieces to which almost no base chips are attached are made to adhere to the semiconductor wafer, and therefore, no defects are caused by base chips.

In accordance with a manufacturing method for a semiconductor device according to the present invention, a base that is made to adhere to a first adhesive sheet is cut into a number of base pieces, a second adhesive sheet is made to adhere to the surfaces of the base pieces on the side opposite to the surfaces which are made to adhere to the first adhesive sheet, the first adhesive sheet is peeled from the base pieces, the base pieces are removed from the second adhesive sheet and are made to adhere to a semiconductor wafer, and this semiconductor wafer is cut into pieces. According to the present invention, the base that is made to adhere to the first adhesive sheet is cut into a number of base pieces, and after that, the second adhesive sheet is made to adhere to the surfaces of the base pieces on the side opposite to the surfaces which are made to adhere to the first adhesive sheet, and then the first adhesive sheet is peeled from the base pieces and the base pieces that have been peeled from the second adhesive sheet are made to adhere to the semiconductor wafer and the semiconductor wafer is cut into pieces. Accordingly, base chips are almost completely removed together with the first adhesive sheet, and thus, base pieces to which almost no base chips are attached are made to adhere to the semiconductor wafer, and therefore, no defective semiconductor devices are caused by base chips.

In accordance with a manufacturing method for a semiconductor device according to the present invention, a base that is made to adhere to a first adhesive sheet is cut into a number of base pieces, a second adhesive sheet is made to adhere to the surfaces of the base pieces on the side opposite to the surfaces which are made to adhere to the first adhesive sheet, the first adhesive sheet is peeled from the base pieces, and the base piece is removed from the second adhesive sheet and is made to adhere to a case member that contains a semiconductor element. According to the present invention, the base that is made to adhere to the first adhesive sheet is cut into a number of base pieces, and after that, the second adhesive sheet is made to adhere to the surfaces of the base pieces on the side opposite to the surfaces which are made to adhere to the first adhesive sheet, and then the first adhesive sheet is peeled from the base pieces and the base piece that has been peeled from the second adhesive sheet is made to adhere to a case member that contains a semiconductor element. Accordingly, base chips are almost completely removed together with the first adhesive sheet, and thus, the base piece to which almost no base chips are attached is made to adhere to a case member, and therefore, no defects are caused by base chips.

In accordance with a manufacturing method for a base piece made to adhere to an adhesive sheet according to the present invention, base chips are removed when the first adhesive sheet is peeled, and therefore, most of the base chips can be easily removed. In accordance with a manufacturing method for a base piece made to adhere to an adhesive sheet according to the present invention, debris that adheres to the film is removed when the second adhesive sheet is peeled, and therefore, most of the debris can be easily removed. In accordance with a manufacturing method for a semiconductor wafer and a manufacturing method for a semiconductor device according to the present invention, the base piece to which almost no base chips adhere can be made to adhere, and therefore, occurrence of defects caused by base chips can be significantly restricted.

The above and further objects and features of the invention will more fully be apparent from the following detailed description with accompanying drawings.

DETAILED DESCRIPTION OF THE INVENTION

In the following, the present is concretely described in reference to the drawings that show the embodiments thereof. The following examples are described in the case where glass in plate form is used as the base and pieces of glass are used as base pieces. The present invention is not limited to the following embodiments, and the embodiments may be modified so that, for example, the glass and glass pieces are arranged on the top of or on the bottom of the adhesive sheet.

EMBODIMENT 1

Figure 1A:
FIGS. 1A and 1B are diagrams showing a conventional process for manufacturing glass pieces.
Figure 1B:
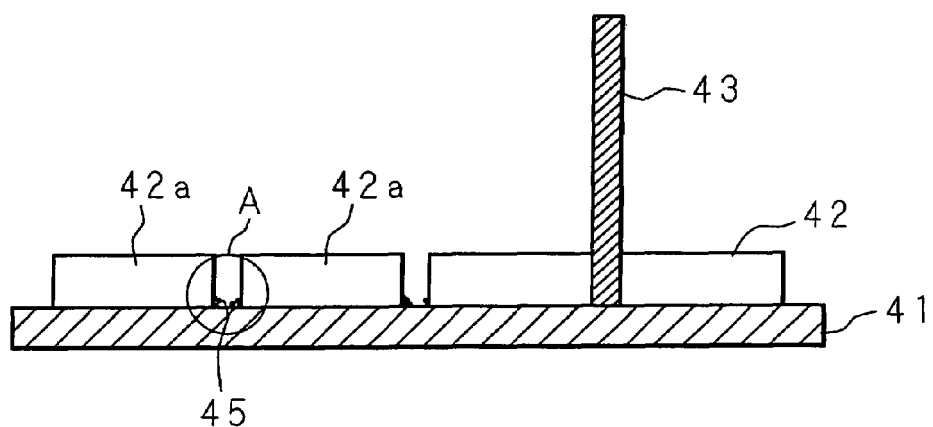
Figure 2:
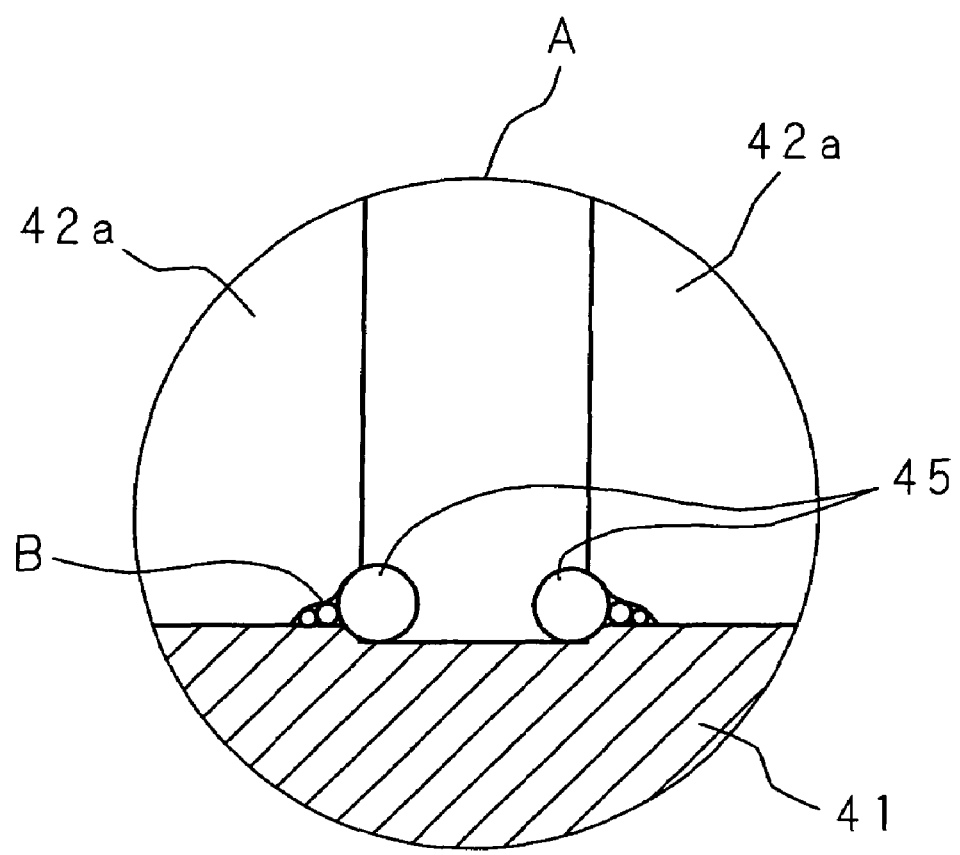
FIG. 2 is an enlarged diagram of region A in FIG. 1B.
Figure 3A:
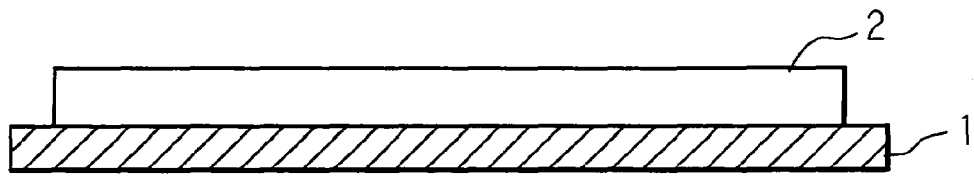
FIGS. 3A to 3D are diagrams showing an example of a process that is in accordance with a manufacturing method for a base piece made to adhere to an adhesive sheet according to the present invention.
Figure 3B:
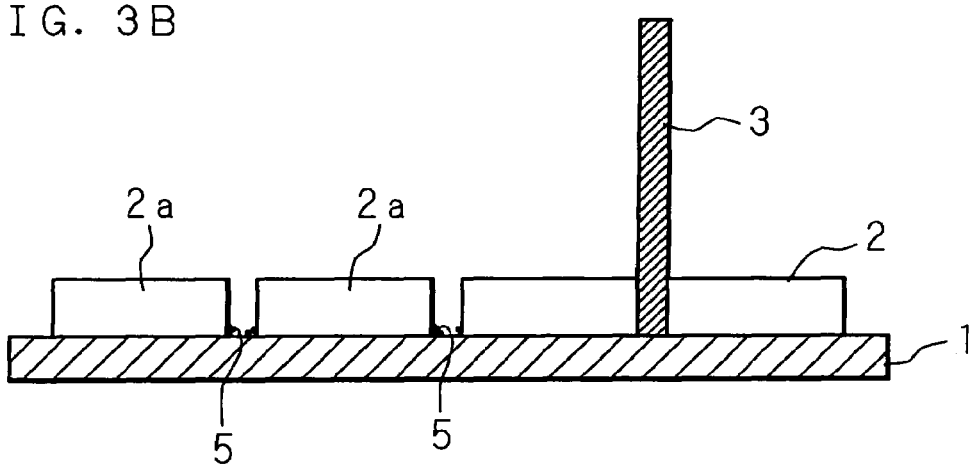

FIGS. 3A to 3D are diagrams showing an example of a process that is in accordance with a manufacturing method for a base piece made to adhere to an adhesive sheet according to the present invention. The adhesive surface of a first adhesive sheet 1 is made to adhere to glass 2 in plate form (FIG. 3A). Next, glass 2 is cut by a blade 3 using a dicing unit or the like, so as to be separated into a number of pieces of glass 2a (FIG. 3B). At this time, glass chips may be removed through the blowing of a gas (for example, blowing of nitrogen) if necessary. In addition, washing may be carried out, using a washing liquid, such as water or a solution, as long as first adhesive sheet 1 can maintain sufficient adhesiveness.

Figure 3C:
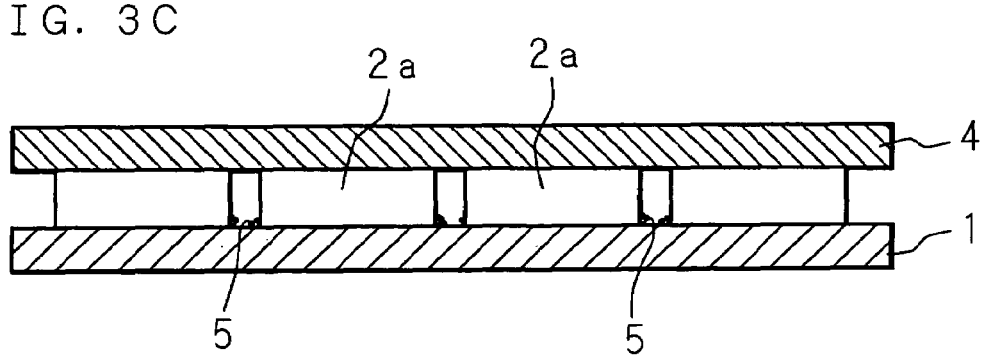

Next, the adhesive surface of a second adhesive sheet 4 is made to adhere to the surface of pieces of glass 2a on the side opposite to the side to which first adhesive sheet 1 is made to adhere (FIG. 3C). As described above, a base piece (a piece of glass 2a, in the present example) which is made to adhere to an adhesive sheet (first adhesive sheet 1 and second adhesive sheet 4, in the present example) is manufactured in such a manner as to correspond to Claim 1. Here, adhesive sheets of which the adhesiveness is lowered through irradiation with light, for example, irradiation with ultraviolet rays, can be used as the above described the first adhesive sheet 1 and the second adhesive sheet 4. In the case where such adhesive sheets are used, it is preferable to lower the adhesiveness of the first adhesive sheet 1 by means of irradiation with light before making the second adhesive sheet 4 adhere to the pieces of glass, in order to make the process for peeling the first adhesive sheet 1 in the below described step easy.

Figure 3D:
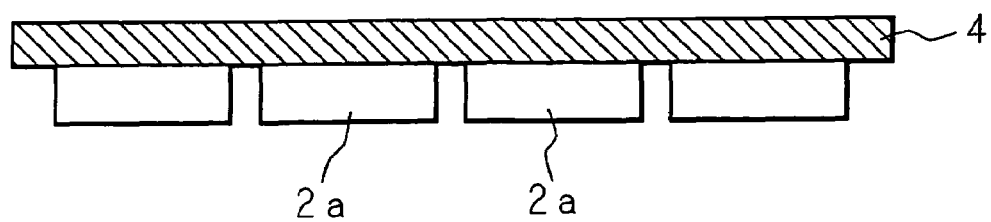

Next, the first adhesive sheet 1 is peeled from glass pieces 2a (FIG. 3D). As described above, a base piece (a piece of glass 2a, in the present example) which is made to adhere to an adhesive sheet (second adhesive sheet 4, in the present example) is manufactured in such a manner as to correspond to Claim 2.

Also according to the present invention, glass chips 5 are created as base chips on the cut parts during the process for cutting glass 2 (FIG. 3B). Created glass chips 5 adhere to the first adhesive sheet 1. Therefore, the first adhesive sheet 1 is peeled in the state where glass chips 5 adhere to the first adhesive sheet 1 after the second adhesive sheet 4 has been made to adhere to the pieces of glass. By doing so, it becomes possible to remove most of glass chips 5 by making them adhere to the first adhesive sheet 1 without breaking up respective pieces of glass 2a that are in the state where they adhere to the second adhesive sheet 4. Here, in the case where some glass chips 5 cannot be removed by peeling first adhesive sheet 1 when glass chips 5 adhere to pieces of glass 2a instead to the first adhesive sheet 1, due to, for example, static electricity, glass chips 5 may be removed through the blowing of a gas. In addition, washing may be carried out using a washing liquid, such as water or a solution, as long as the second adhesive sheet 4 can maintain sufficient adhesiveness.

EMBODIMENT 2

Figure 4A:
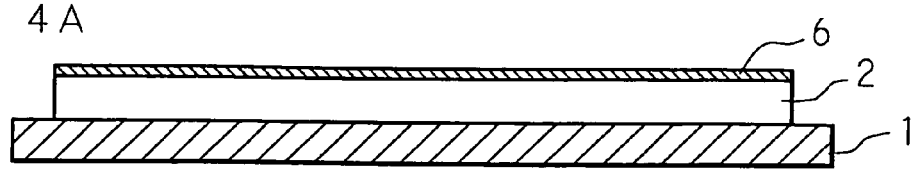
FIGS. 4A to 4F are diagrams showing another example of a process that is in accordance with a manufacturing method for a base piece made to adhere to an adhesive sheet according to the present invention.
Figure 4B:
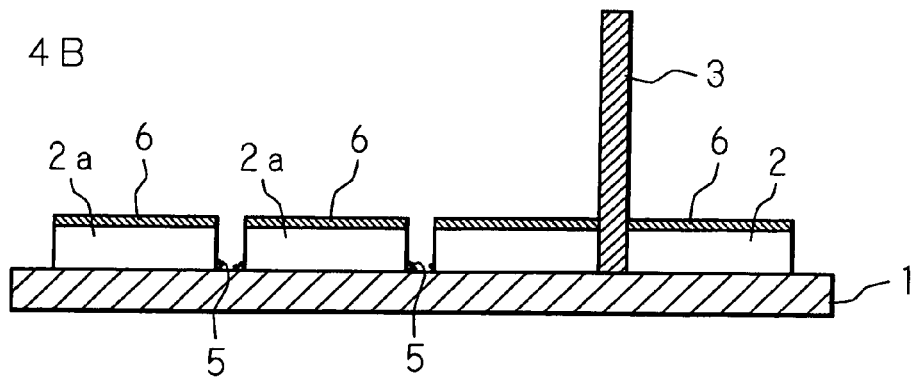

FIGS. 4A to 4F are diagrams showing another example of a process that is in accordance with a manufacturing method for a base piece made to adhere to an adhesive sheet according to the present invention. The adhesive surface of a first adhesive sheet 1 is made to adhere to glass 2 in plate form (FIG. 4A). An infrared ray blocking film 6 is formed on the surface (surface on the side opposite to the surface to which the first adhesive sheet 1 adheres) of glass 2 using, for example, a physical vapor deposition method. Next, glass 2 with infrared ray blocking film 6 is cut by a blade 3 using a dicing unit or the like, so as to be separated into a number of pieces of glass 2a (FIG. 4B). At this time, in the same manner as in Embodiment 1, blowing of a gas or washing with a solution may be carried out, if necessary.

Figure 4C:
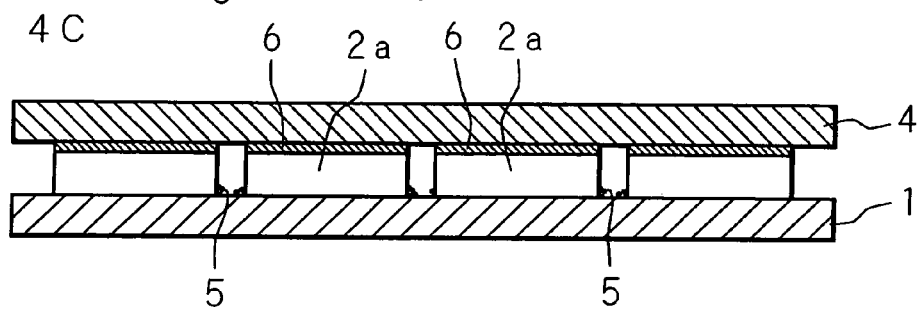

Next, the adhesive surface of a second adhesive sheet 4 is made to adhere to the surface of pieces of glass 2a on the side opposite to the surface to which the first adhesive sheet 1 adheres, that is to say, to the top of infrared ray blocking film 6 (FIG. 4C). Here, adhesive sheets of which the adhesiveness is lowered through irradiation with light, for example, irradiation with ultraviolet rays, can be used as the above described first adhesive sheet 1 and second adhesive sheet 4. In the case where such adhesive sheets are used, it is preferable to lower the adhesiveness of the first adhesive sheet 1 through irradiation with light before the second adhesive sheet 4 is made to adhere to the pieces of glass, in order to make the process for peeling the first adhesive sheet 1 in the below described step easy.

Figure 4D:
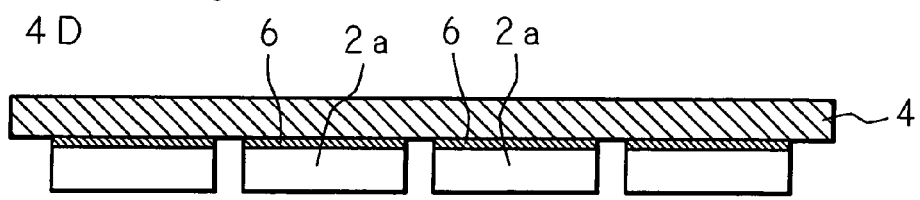

Next, the first adhesive sheet 1 is peeled from pieces of glass 2a (FIG. 4D). In the same manner as in Embodiment 1, the first adhesive sheet 1 is peeled in the state where glass chips 5 adhere to the first adhesive sheet 1 after the second adhesive sheet 4 has been made to adhere to the pieces of glass, and therefore, it is possible to remove most of glass chips 5 by making them adhere to the first adhesive sheet 1 without breaking up respective pieces of glass 2a that are in the state where they adhere to the second adhesive sheet 4. Here, blowing of a gas or washing with a solution may be carried out, if necessary, in the same manner as in Embodiment 1.

Figure 4E:
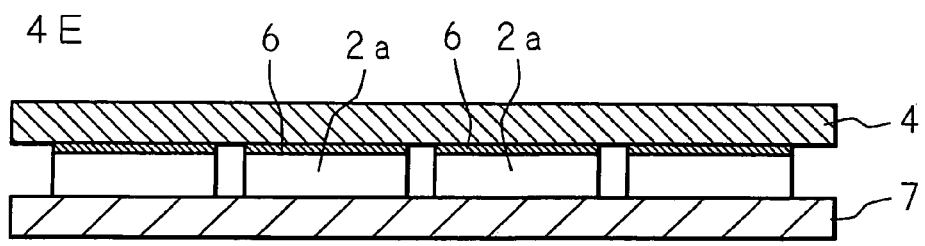

Next, the adhesive surface of a third adhesive sheet 7 is made to adhere to the surface of pieces of glass 2a on the side opposite to the surface on which infrared ray blocking film 6 has been provided, in other words, to the surface to which the first adhesive sheet 1 has been made to adhere (FIG. 4E). As described above, a base piece (a piece of glass 2a, in the present example) having a film (infrared ray blocking film 6, in the present example) which is made to adhere to an adhesive sheet (second adhesive sheet 4 and third adhesive sheet 7, in the present example) is manufactured in such as manner as to correspond to Claim 3. In the case where an adhesive sheet of which the adhesiveness is lowered through irradiation with light, for example, irradiation with ultraviolet rays, is used as the second adhesive sheet 4, as described above, it is preferable to lower the adhesiveness of the second adhesive sheet 4 through irradiation with light before the third adhesive sheet 7 is made to adhere to the pieces of glass, in order to the process for peeling of the second adhesive sheet 4 in the below described step easy.

Figure 4F:
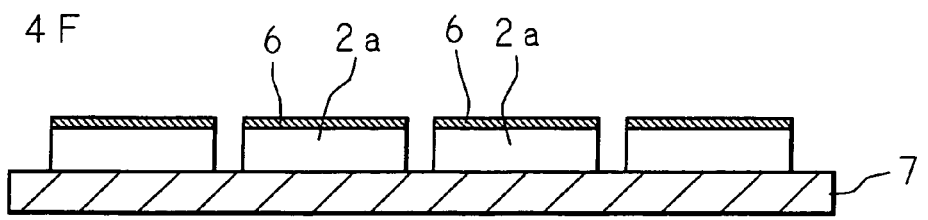

Next, the second adhesive sheet 4 is peeled from pieces of glass 2a (FIG. 4F). As described above, a base piece (a piece of glass 2a, in the present example) having a film (infrared ray blocking film 6, in the present example) which is made to adhere to an adhesive sheet (third adhesive sheet 7, in the present example) is manufactured in such a manner as to correspond to Claim 4.

The surface of infrared ray blocking film 6 lacks smoothness in comparison with the glass surface, and it becomes easy for debris to attach to the film. Accordingly, it is considered that in many cases, debris is attached to the surface of pieces of glass 2a on which infrared ray blocking film 6 has been provided. In embodiment 2, such debris is removed. Debris on the surface of infrared ray blocking film 6 is attached to the second adhesive sheet 4. Therefore, the second adhesive sheet 4 is peeled in the state where debris is attached to the second adhesive sheet 4 after the third adhesive sheet 7 has been made to adhere to the pieces of glass. By doing so, it is possible to remove most of the debris that is attached to the infrared ray blocking film 6.

Here, though in the above described example, a case is described where the infrared ray blocking film 6 is provided on glass 2 (pieces of glass 2a), the provided film is not limited to such an infrared blocking film, but rather, the same effects can be gained with other types of films, such as light reflection preventing films, transparent conductive films and protective films.

EMBODIMENT 3

Figure 5A:
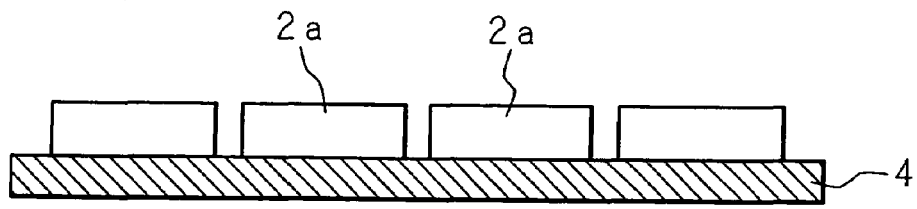
FIGS. 5A to 5D are diagrams showing a process that is in accordance with a manufacturing method for a semiconductor wafer according to the present invention.
Figure 5B:
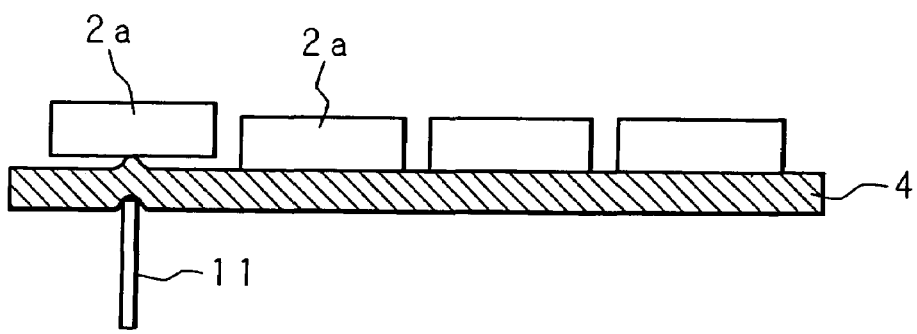

FIGS. 5A to 5D are diagrams showing a process that is in accordance with a manufacturing method for a semiconductor wafer according to the present invention. First, a semi-finished product which has been manufactured in accordance with the above described Embodiment 1 and where a number of pieces of glass 2a have been made to adhere to the second adhesive sheet 4 is prepared (FIG. 5A). As described above, an adhesive sheet of which the adhesiveness is lowered through irradiation with light, for example, irradiation with ultraviolet rays, can be used as the second adhesive sheet 4, and in the case where such an adhesive sheet is used, it is preferable to lower the adhesiveness of the second adhesive sheet 4 in advance through irradiation with light, in order to make the process for peeling pieces of glass 2a in the below described step easy.

Figure 5C:
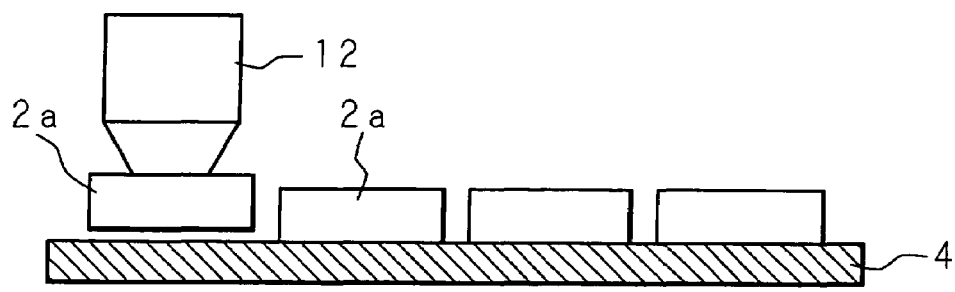

The rear surface portion of the second adhesive sheet 4 that corresponds to a piece of glass 2a that is the object of peeling is pushed upward by a pin 11, so as to gain the state where piece of glass 2a has been partially peeled from the second adhesive sheet 4 (FIG. 5B), and after that, piece of glass 2a is attracted through suction to a suction unit 12, and thus, piece of glass 2a is peeled from the second adhesive sheet 4 (FIG. 5C).

Figure 5D:
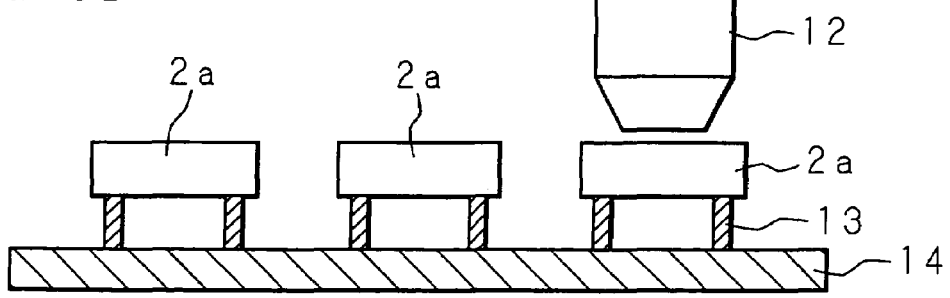

After this, the suction unit 12 that has attracted piece of glass 2a through suction is moved to a position above a semiconductor wafer 14 on the surface of which a number of adhesive layers 13 have been formed in a pattern, and piece of glass 2a is positioned so that it is made to adhere to the semiconductor wafer 14 via an adhesive layer 13, and after that, the suction of the suction unit 12 is released, and piece of glass 2a is made to adhere to the wafer (FIG. 5D). This operation is repeated, and thereby, the semiconductor wafer 14 to which a number of base pieces (pieces of glass 2a, in the present example) are made to adhere is manufactured in such a manner as to correspond to Claim 5.

Here, in a portion where a lid is formed of a piece of glass 2a (not shown) in the semiconductor wafer 14, a light receiving portion having a micro lens is formed on the surface, providing a configuration where incident light is condensed on the light receiving element of each pixel.

In Embodiment 3, pieces of glass 2a to which barely any glass chips 5 are attached are made to adhere to the semiconductor wafer 14, and therefore, defects are rarely caused by glass chips 5.

EMBODIMENT 4

FIGS. 6A to 6E are diagrams showing an example of a process that is in accordance with a manufacturing method for a semiconductor device according to the present invention. The process of FIGS. 6A to 6D is similar to the process of FIGS. 5A to 5D of Embodiment 3, and therefore, the same numbers are attached to parts that are the same, and the descriptions thereof are omitted.

Figure 6A:
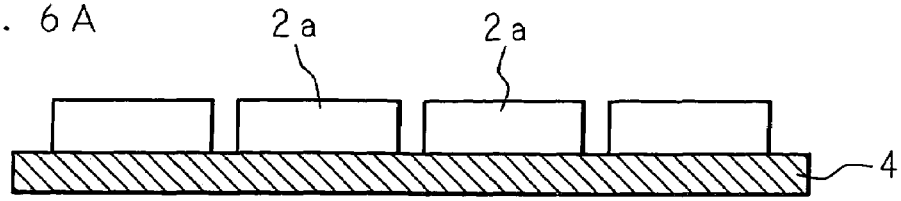
FIGS. 6A to 6E are diagrams showing an example of a process that is in accordance with a manufacturing method for a semiconductor device according to the present invention.
Figure 6B:
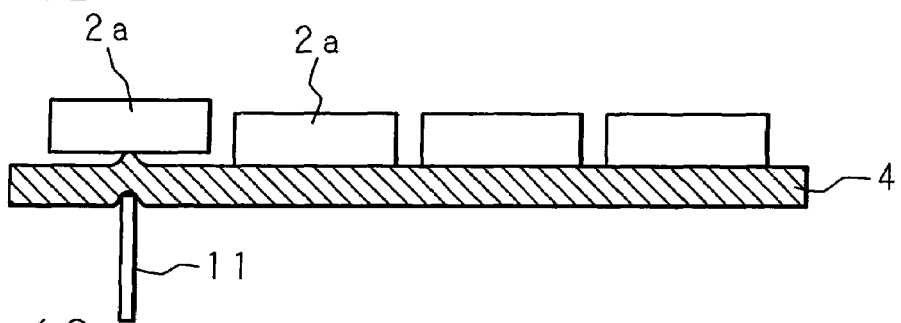
Figure 6C:
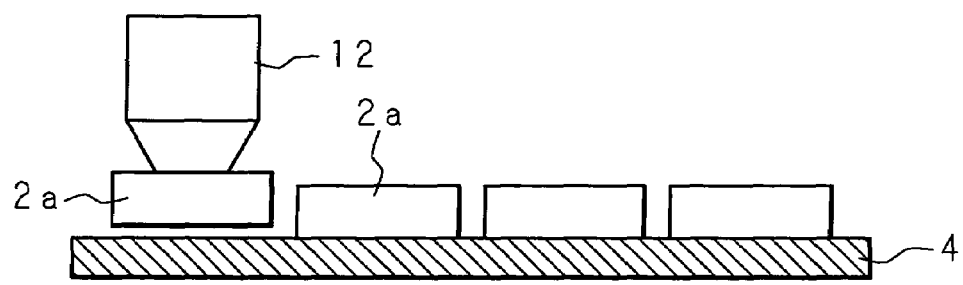
Figure 6D:
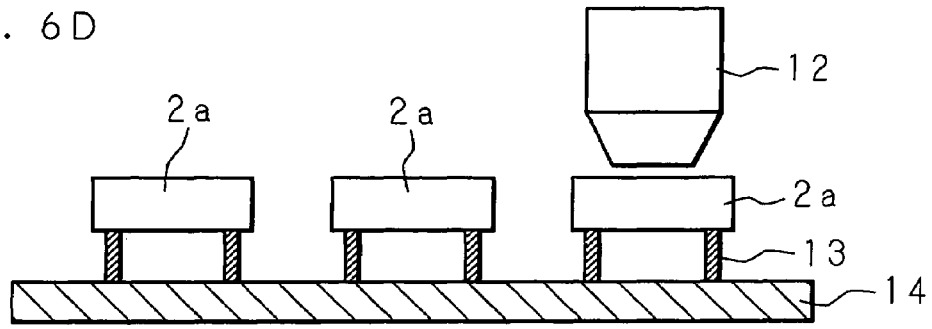
Figure 6E:
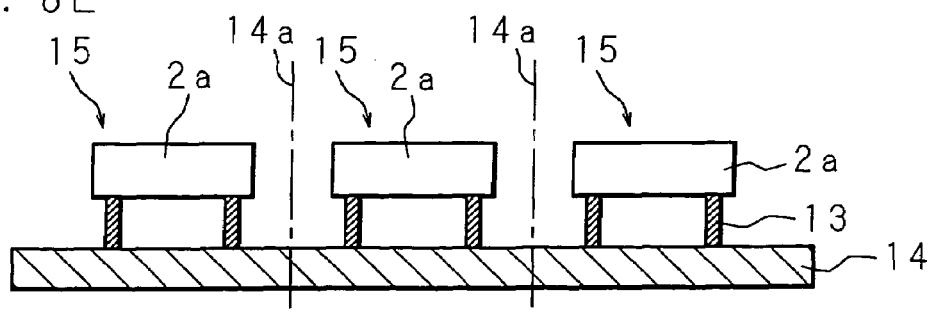

The semiconductor wafer 14 that has been manufactured in the process of FIGS. 6A to 6D is cut along dividing lines 14a using a dicing unit or the like, and thereby, a semiconductor device (solid state imaging device 15, in the present example) to which a base piece (a piece of glass 2a, in the present example) is made to adhere is manufactured in such a manner as to correspond to Claim 6 (FIG. 6E).

Here, a semiconductor device according to the present invention may be any type of semiconductor device where a lid is formed of a piece of glass, such as a solid state imaging device, including a CCD and a CMOS imager, or a semiconductor memory device, including an EPROM.

EMBODIMENT 5

Figure 7A:
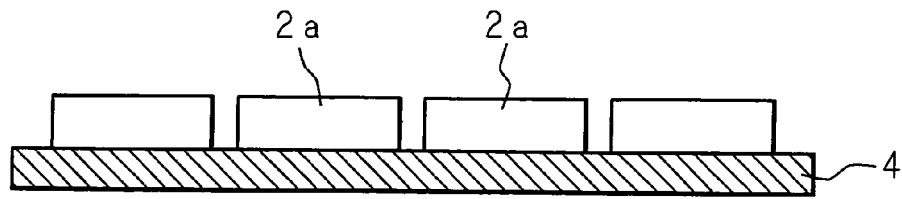
FIGS. 7A to 7D are diagrams showing another example of a process that is in accordance with a manufacturing method for a semiconductor device according to the present invention.
Figure 7B:
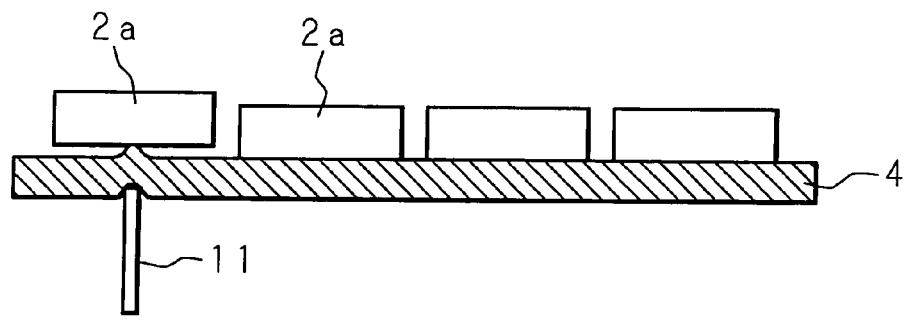
Figure 7C:
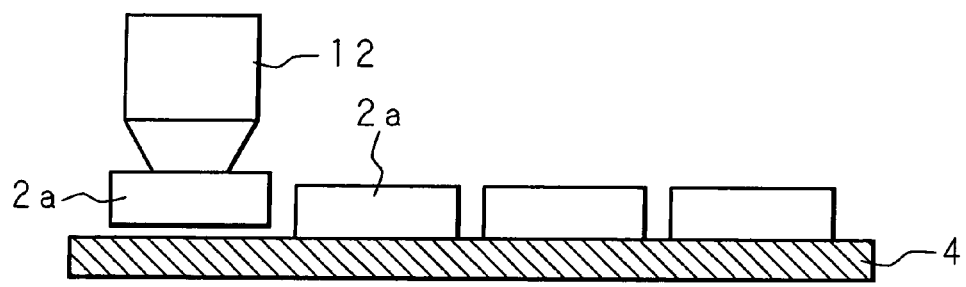

FIGS. 7A to 7D are diagrams showing another example of a process that is in accordance with a manufacturing method for a semiconductor device according of the present invention. The process of FIGS. 7A to 7C is similar to the process of FIGS. 5A to 5C of Embodiment 3, and therefore, the same numbers are attached to parts that are the same, and the descriptions thereof are omitted.

Figure 7D:
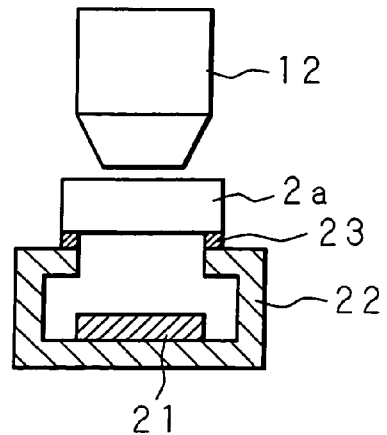

The suction unit 12 that has attracted a piece of glass 2a through suction is shifted to a position above a case member 22 that contains a semiconductor element 21 having a light receiving portion, and piece of glass 2a is positioned so that it is made to adhere to the case member 22 via an adhesive layer 23, and after that, piece of glass 2a is made to adhere with suction of the suction unit 12 released (FIG. 7D). As described above, a semiconductor device where a base piece (a piece of glass 2a, in the present example) is made to adhere to the case member 22 that contains the semiconductor element 21 is manufactured in such a manner as to correspond to claim 7.

Here, though in Embodiments 3 to 5, cases where a piece of glass 2a that has been manufactured in accordance with Embodiment 1 is utilized are described, a semiconductor wafer or a semiconductor device can, of course, be manufactured in the same manner in the case where a piece of glass 2a with infrared ray blocking film 6 that has been manufactured in accordance with Embodiment 2 is utilized. In the case where a piece of glass 2a with infrared ray blocking film 6 that has been manufactured in accordance with Embodiment 2 is utilized in Embodiments 3 to 5, the second adhesive sheet 4 shown in FIGS. 5 to 7 is replaced with the third adhesive sheet 7, and the infrared ray blocking film 6 is placed above a piece of glass 2a as shown in FIGS. 5 to 7. In this case, the surface on which the infrared ray blocking film 6 is placed can be positioned on the far side of the semiconductor wafer 14 without flipping pieces of glass 2a, and therefore, when this is applied to a solid state imaging device, the occurrence of defects caused by debris that may be mixed or attached to the infrared ray blocking film 6 can be easily reduced.

In addition, though glass is utilized as a base in the above described examples, it is possible to use a semiconductor base, such as a silicon base, in addition to glass, and the present invention can be applied to such cases in the same manner. A silicon wafer where a functional element has been formed and to which a piece of silicon for a protective cap is made to adhere can be cited as an example where the present invention is applied to a semiconductor wafer that uses a semiconductor base, such as a silicon base. In addition, a cut part of such a silicon wafer to which a piece of silicon for a protective cap has been made to adhere can be cited as an example where the present invention is applied to a semiconductor device that uses a semiconductor base, such as a silicon base.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A manufacturing method for a semiconductor wafer, comprising the steps of:
   cutting a glass base that is adhered to a first adhesive sheet into a number of base pieces;
   lowering the adhesiveness of the first adhesive sheet by irradiation with light;
   making a second adhesive sheet adhere to the surfaces of said base pieces on the side opposite to the surfaces which are made to adhere to said first adhesive sheet;
   peeling said first adhesive sheet from said base pieces, such that base chips adhered to the first adhesive sheet are removed;
   removing base chips adhered to the base pieces by blowing of a gas or by washing using a washing liquid;
   lowering the adhesiveness of the second adhesive sheet by irradiation with light; and
   peeling said base pieces from said second adhesive sheet and making said base pieces adhere to a semiconductor wafer via an adhesive layer, said semiconductor wafer having a functional element.

2. A manufacturing method for a semiconductor device, comprising the steps of:
   cutting a glass base that is adhered to a first adhesive sheet into a number of base pieces;
   lowering the adhesiveness of the first adhesive sheet by irradiation with light;
   making a second adhesive sheet adhere to the surfaces of said base pieces on the side opposite to the surfaces which are made to adhere to said first adhesive sheet;
   peeling said first adhesive sheet from said base pieces, such that base chips adhered to the first adhesive sheet are removed;
   removing base chips adhered to the base pieces by blowing of a gas or by washing using a washing liquid;
   lowering the adhesiveness of the second adhesive sheet by irradiation with light;
   peeling said base pieces from said second adhesive sheet and making said base pieces adhere to a semiconductor wafer via an adhesive layer, said semiconductor wafer having a functional element; and
   cutting the semiconductor wafer into pieces.

3. A manufacturing method for a semiconductor device, comprising the steps of:
   cutting a glass base that is adhered to a first adhesive sheet into a number of base pieces;
   lowering the adhesiveness of the first adhesive sheet by irradiation with light;
   making a second adhesive sheet adhere to the surfaces of said base pieces on the side opposite to the surfaces which are made to adhere to said first adhesive sheet;
   peeling said first adhesive sheet from said base pieces, such that base chips adhered to the first adhesive sheet are removed;
   removing base chips adhered to the base pieces by blowing of a gas or by washing using a washing liquid;
   lowering the adhesiveness of the first adhesive sheet by irradiation with light; and
   peeling a base piece from said second adhesive sheet and making said base piece adhere to an opening part of a case member that contains a semiconductor element.

4. The manufacturing method for a semiconductor wafer according to claim 1, wherein said functional element is a light receiving portion.

5. The manufacturing method for a semiconductor device according to claim 2, wherein said functional element is a light receiving portion.

* * * * *